(12) United States Patent
Kim et al.

(10) Patent No.: US 11,579,496 B2
(45) Date of Patent: Feb. 14, 2023

(54) CURVED DISPLAY DEVICE INCLUDING A PRINTED CIRCUIT BOARD

(71) Applicant: SAMSUNG DISPLAY CO, LTD., Yongin-si (KR)

(72) Inventors: Sunghyun Kim, Hwaseong-si (KR); Namsoo Kang, Asan-si (KR); Soonkyeong Kwon, Seoul (KR); Yoonsup Kim, Suwon-si (KR); Sewon Min, Asan-si (KR); Kihyun Sung, Incheon (KR); JunYong Ahn, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 419 days.

(21) Appl. No.: 16/241,699

(22) Filed: Jan. 7, 2019

(65) Prior Publication Data

US 2019/0212623 A1 Jul. 11, 2019

(30) Foreign Application Priority Data

Jan. 8, 2018 (KR) .................. 10-2018-0002334

(51) Int. Cl.
*G02F 1/1345* (2006.01)
*G02F 1/1362* (2006.01)
*G02F 1/1333* (2006.01)
*H05K 1/18* (2006.01)
*G09G 3/36* (2006.01)

(52) U.S. Cl.
CPC .... *G02F 1/13452* (2013.01); *G02F 1/133305* (2013.01); *G02F 1/136286* (2013.01); *G09G 3/3688* (2013.01); *H05K 1/189* (2013.01); *H05K 2201/10136* (2013.01)

(58) Field of Classification Search
CPC ........... G02F 1/13454; G02F 1/136286; G02F 1/133305; G02F 1/13452–13458; G02F 1/1345
See application file for complete search history.

(56) References Cited

U.S. PATENT DOCUMENTS

| | | | |
|---|---|---|---|
| 9,277,669 B2* | 3/2016 | Oh .......................... | H05K 7/06 |
| 9,568,788 B2* | 2/2017 | Shibahara ......... | G02F 1/133382 |
| 2011/0267792 A1 | 11/2011 | Kim | |
| 2012/0056859 A1* | 3/2012 | Chen ....................... | G09G 3/20 |
| | | | 345/204 |

(Continued)

FOREIGN PATENT DOCUMENTS

| KR | 10-2011-0121918 | 11/2011 |
|---|---|---|
| KR | 1020170105170 | 9/2017 |

*Primary Examiner* — Dung T Nguyen
(74) *Attorney, Agent, or Firm* — F. Chau & Associates, LLC

(57) ABSTRACT

A display device may include a display panel having a display area and a non-display area located in a first direction from the display area, a printed circuit board located in the first direction from the non-display area and configured to generate a signal, a driving film connected to the non-display area of the display panel and configured to drive the display panel in response to the signal, and a connecting film having a first end connected to the non-display area of the display panel and a second end connected to the printed circuit board. The connecting film electrically connects the printed circuit board and the driving film.

17 Claims, 4 Drawing Sheets

(56) References Cited

U.S. PATENT DOCUMENTS

| | | | |
|---|---|---|---|
| 2014/0055702 A1* | 2/2014 | Park | H01L 27/3279 349/43 |
| 2015/0316810 A1* | 11/2015 | Shibahara | G02F 1/133382 349/150 |
| 2017/0099736 A1* | 4/2017 | Jung | G02F 1/13452 |
| 2020/0058722 A1* | 2/2020 | Li | H01L 27/12 |

* cited by examiner

CURVED DISPLAY DEVICE INCLUDING A PRINTED CIRCUIT BOARD

CROSS-REFERENCE TO RELATED APPLICATION

This application claims priority under 35 U.S.C. § 119 to Korean Patent Application No. 10-2018-0002334, filed on Jan. 8, 2018 in the Korean Intellectual Property Office (KIPO), the disclosure of which is incorporated by reference herein in its entirety.

TECHNICAL FIELD

Exemplary embodiments relate to a display device and more particularly, to a curved display device including a printed circuit board.

DISCUSSION OF RELATED ART

Examples of a flat panel display device include a liquid crystal display (LCD), a field emission display (FED), a plasma display panel (PDP), an organic light emitting diode (OLED) display, etc. The size of a screen of a flat panel display device tends to be larger when the flat panel display device is used as a display device for a television receiver. As the size of the screen of the flat panel display device increases, the picture quality at different viewing angles may vary depending on whether a viewer sees the center or left and right ends of the screen. To compensate for a viewing angle difference, a flat panel display device may be formed into a curved type display, e.g., a concave type or a convex type. The curved flat panel display device may be a portrait type in which the vertical length is longer than the horizontal width thereof and which is curved in a vertical direction, or a landscape type in which the vertical length is shorter than the horizontal width thereof and which is curved in a horizontal direction.

A display device may generally include a display panel for displaying an image and a printed circuit board for supplying signals to the display panel and for controlling the display panel. A driving film on which a driving integrated circuit is mounted may be used as means for electrically connecting the display panel and the printed circuit board. The driving film may include a flexible printed circuit (FPC), a flexible flat cable (FFC), or the like.

SUMMARY

According to an exemplary embodiment of the inventive concept, a display device may include a display panel having a display area and a non-display area located in a first direction from the display area, a printed circuit board located in the first direction from the non-display area and configured to generate a signal, a driving film connected to the non-display area of the display panel and configured to drive the display panel in response to the signal, and a connecting film having a first end connected to the non-display area of the display panel and a second end connected to the printed circuit board. The connecting film electrically connects the printed circuit board and the driving film.

In an exemplary embodiment of the inventive concept, the display panel may include a connecting wiring disposed on the non-display area, and the connecting wiring connects the connecting film and the driving film.

In an exemplary embodiment of the inventive concept, the signal may be transmitted from the printed circuit board to the driving film through the connecting film and the connecting wiring.

In an exemplary embodiment of the inventive concept, the display panel may further include a fan-out wiring disposed on the non-display area, and the fan-out wiring connects the driving film and the display area.

In an exemplary embodiment of the inventive concept, the display panel may further include a gate wiring and a data wiring disposed on the display area. The gate wiring and the data wiring may cross each other. The connecting wiring may be disposed on the same layer as the gate wiring, and the fan-out wiring may be disposed on the same layer as the data wiring.

In an exemplary embodiment of the inventive concept, the driving film may be spaced apart from the printed circuit board.

In an exemplary embodiment of the inventive concept, the display device may further include a plurality of driving films. The plurality of driving films may be electrically connected to the connecting film.

In an exemplary embodiment of the inventive concept, the plurality of driving films may be connected to the non-display area along a second direction crossing the first direction. The connecting film may be connected to a center of the non-display area.

In an exemplary embodiment of the inventive concept, the connecting film may be bent.

In an exemplary embodiment of the inventive concept, the display device may further include a backlight unit configured to supply light to the display panel. The first end of the connecting film may be disposed on a first surface of the display panel, and the backlight unit may be disposed on a second surface of the display panel opposite to the first surface.

In an exemplary embodiment of the inventive concept, the connecting film may be bent such that the display panel and the printed circuit board are opposite to each other with the backlight unit disposed in between the display panel and the printed circuit board.

In an exemplary embodiment of the inventive concept, the printed circuit board may include a connector connected to the connecting film.

In an exemplary embodiment of the inventive concept, the connecting film may be one of a flexible flat cable (FFC) or a flexible printed circuit (FPC).

In an exemplary embodiment of the inventive concept, a length of the connecting film in the first direction may be greater than a length of the driving film in the first direction.

In an exemplary embodiment of the inventive concept, the driving film may be substantially flat.

In an exemplary embodiment of the inventive concept, the driving film may be bent.

In an exemplary embodiment of the inventive concept, the driving integrated circuit may be mounted on the driving film in a chip-on-film (COF) manner.

In an exemplary embodiment of the inventive concept, the display panel may have a curved shape along a second direction crossing the first direction.

According to an exemplary embodiment of the inventive concept, a display device may include a display panel including data wirings, a printed circuit board spaced apart from the display panel, a plurality of driving films connected to the display panel, and a connecting film connected to the printed circuit board and the display panel. The connecting film may be electrically connected to the plurality of driving films via connecting wirings. The plurality of driving films may be electrically connected to the data wirings via fan-out wirings.

According to an exemplary embodiment of the inventive concept, a display device may include a display panel having a first surface and a second surface opposite to the first surface, a backlight unit disposed on the second surface of the display panel, a printed circuit board disposed on the backlight unit, where the backlight unit is disposed between the printed circuit board and the display panel, a driving film disposed on the first surface of the display panel, where the driving film is substantially flat, and a connecting film connecting the printed circuit board and the first surface of the display panel, where the connecting film is bent.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
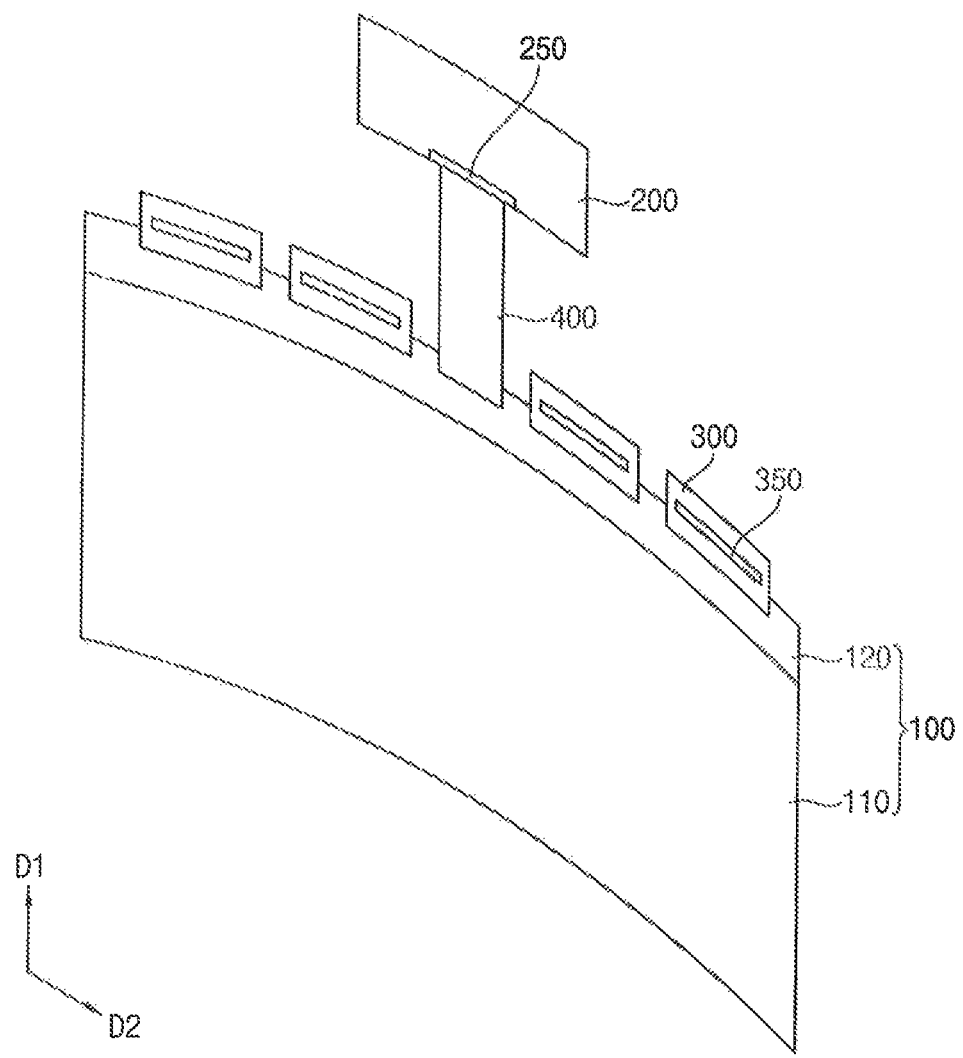
FIG. 1 is a perspective view illustrating a display device according to an exemplary embodiment of the inventive concept.

Exemplary embodiments of the inventive concept provide a display device for preventing a driving film from being distorted.

Hereinafter, exemplary embodiments of the inventive concept will be explained in detail with reference to the accompanying drawings. Like reference numerals may refer to like elements throughout this application.

Hereinafter, elements of a display device according to an exemplary embodiment of the inventive concept will be described with reference to FIGS. 1 and 2.

FIG. 1 is a perspective view illustrating a display device according to an exemplary embodiment of the inventive concept. FIG. 2 is a plan view illustrating the display device in FIG. 1 according to an exemplary embodiment of the inventive concept.

Figure 2:
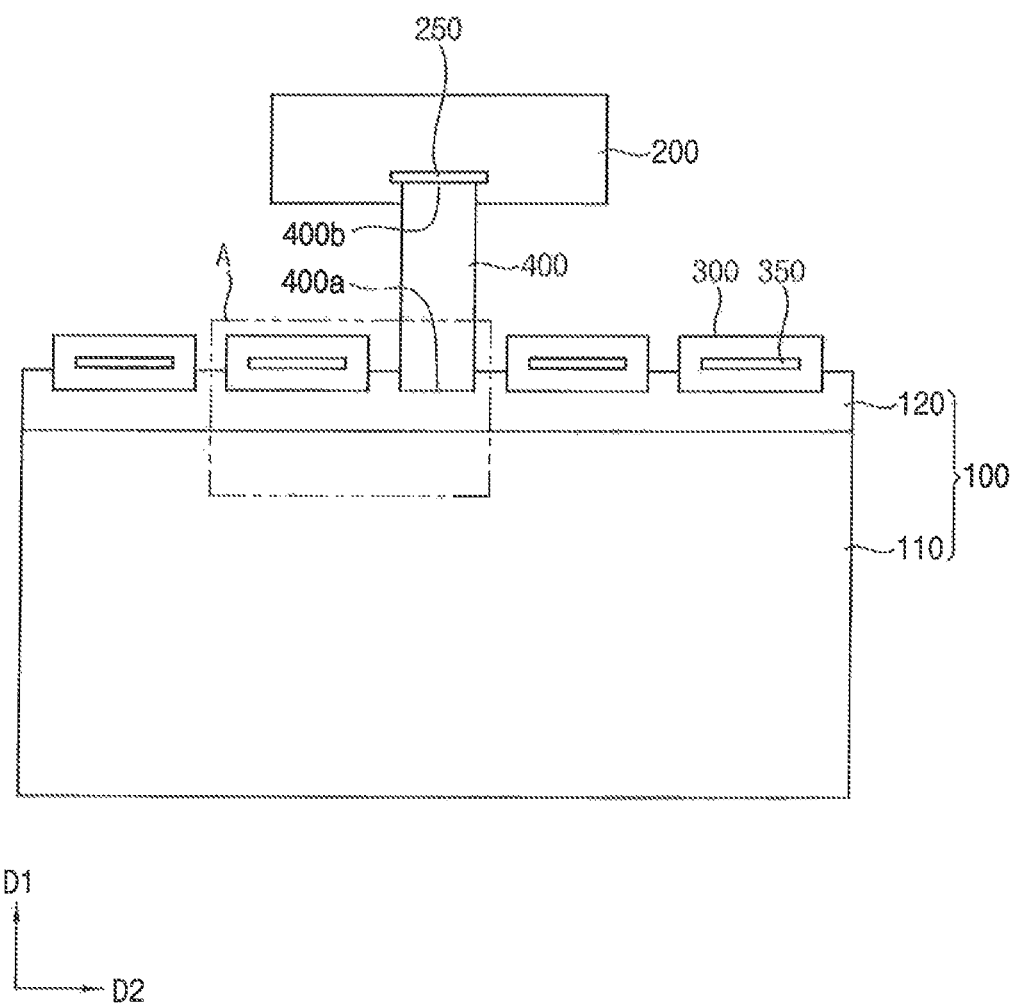
FIG. 2 is a plan view illustrating the display device in FIG. 1 according to an exemplary embodiment of the inventive concept.

Referring to FIGS. 1 and 2, a display device according to an exemplary embodiment of the inventive concept may include a display panel 100, a printed circuit board 200, a driving film 300, and a connecting film 400.

The display panel 100 may include a display area 110 and a non-display area 120. The display area 110 may display an image. Pixels emitting light for displaying the image may be disposed in the display area 110. The non-display area 120 may be located in a first direction D1 from the display area 110. Pads receiving signals from the printed circuit board 200 or the driving film 300 may be disposed in the non-display area 120.

The display panel 100 may include a substrate formed of an insulation material such as glass, quartz, ceramic, metal, plastic, or the like. Since the substrate in the present exemplary embodiment includes a flexible material such as polyimide (PI) or the like, the display panel 100 may have flexibility, by which the display panel 100 may be curved, may be completely folded or bent around one or more axes, may be stretched, or may be rolled.

In other words, the display device according to an exemplary embodiment of the inventive concept may be a curved display device. In this case, the display panel 100 may have a curved shape according to a second direction D2 crossing the first direction D1, as illustrated in FIG. 1.

The printed circuit board 200 may be spaced apart form the display panel 100, and may be located in the first direction D1 from the non-display area 120 of the display panel 100. The printed circuit board 200 may include a timing controller that generates signals. For example, the timing controller may generate a data signal and a control signal.

The driving film 300 may be connected to the non-display area 120 of the display panel 100. The driving film 300 may include a driving integrated circuit 350. The driving integrated circuit 350 may operate the display panel 100 based on the signals generated by the timing controller. For example, the driving integrated circuit 350 may generate a data voltage based on the data signal and the control signal, and may apply the data voltage to the display panel 100. In this case, the driving integrated circuit 350 may include a data driving circuit.

The driving integrated circuit 350 may be mounted on the driving film 300 in a chip-on-film (COF) manner. For example, the driving integrated circuit 350 may be mounted on a flexible insulation film having a material such as polyimide (PI), and the driving integrated circuit 350 may be electrically connected to the display panel 100 through wirings disposed on the flexible insulation film. However, the inventive concept is not limited thereto, and, for example, the driving integrated circuit 350 may be mounted in a chip-on-glass (COG) manner.

The connecting film 400 may connect the display panel 100 and the printed circuit board 200. A first end 400a of the connecting film 400 may be connected to the non-display area 120 of the display panel 100, and a second end 400b of the connecting film 400 may be connected to the printed circuit board 200. The connecting film 400 may electrically connect the printed circuit board 200 and the driving film 300. An electrical connection between the printed circuit board 200 and the driving film 300 will be described in detail with reference to FIG. 3.

The printed circuit board 200 may include a connector 250. The connecting film 400 may be connected to the connector 250 of the printed circuit board 200. However, the inventive concept is not limited thereto, and the printed circuit board 200 and the connecting film 400 may be connected through a soldering, or the like.

The connecting film 400 may be a flexible flat cable (FFC) or a flexible printed circuit (FPC). Accordingly, the connecting film 400 may be bent or folded.

The driving film 300 may be spaced apart from the printed circuit board 200. In other words, the driving film 300 and the printed circuit board 200 may not be directly connected to each other. However, although the driving film 300 is spaced apart form the printed circuit board 200, the driving film 300 may be electrically connected to the printed circuit board 200 through the connecting film 400, so that signals may be transmitted from the printed circuit board 200 to the driving film 300.

A length of the connecting film 400 in the first direction D1 may be greater than a length of the driving film 300 in the first direction D1. Therefore, the printed circuit board 200 may not be in contact with the driving film 300, and may be spaced apart from the driving film 300 in the first direction D1.

For example, a single connecting film 400 and a plurality of driving films 300 may be disposed on the non-display area 120 of the display panel 100. The driving films 300 may be electrically connected to the single connecting film 400.

The driving films 300 may be connected to the non-display area 120 of the display panel 100 along the second direction D2. The connecting film 400 may be connected to a center of the non-display area 120 of the display panel 100. For example, the driving films 300 may be symmetrically arranged with respect to the connecting film 400 in the second direction D2 as illustrated in FIG. 2.

In the display device according to the present exemplary embodiment, the display panel 100 and the printed circuit board 200 may not be connected through the plurality of driving films 300, but may be connected through the single connecting film 400. Accordingly, although the display panel 100 has a curved shape along the second direction D2, distortions of the driving films 300 caused by different stresses applied thereto may be prevented.

Hereinafter, an electrical connection between the driving films 300 and the connecting film 400 will be described with reference to FIG. 3.

Figure 3:
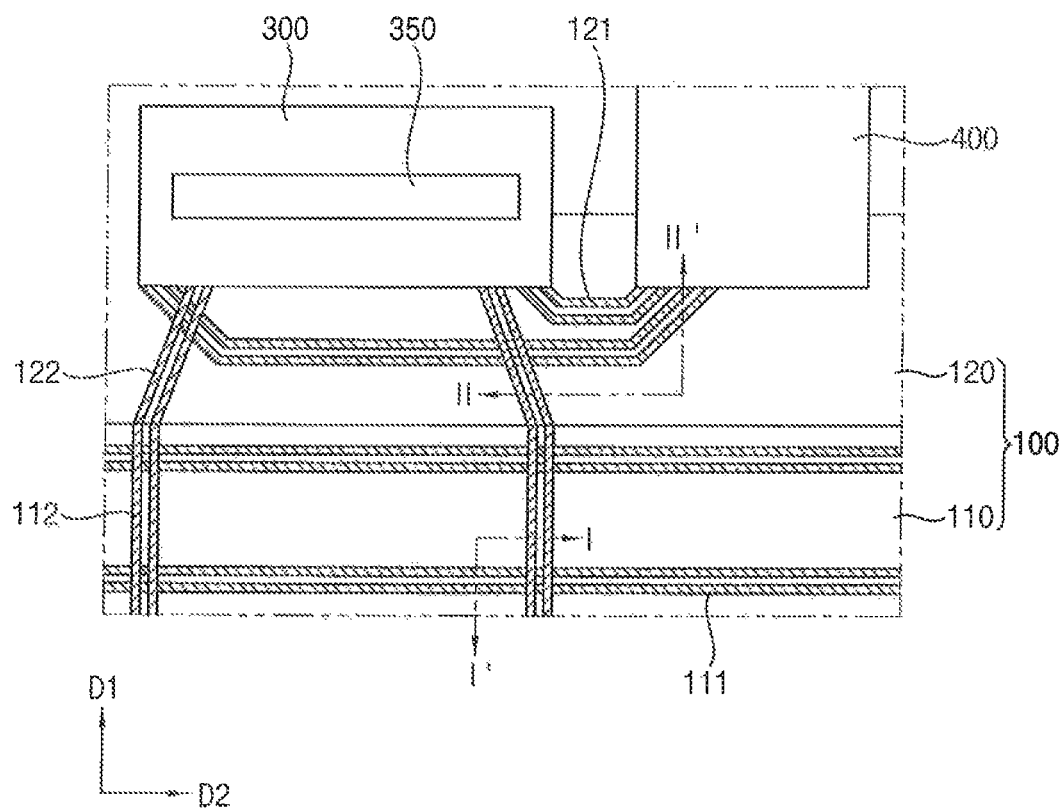
FIG. 3 is a plan view illustrating an area A of the display device in FIG. 2 according to an exemplary embodiment of the inventive concept.

FIG. 3 is a plan view illustrating an area A of the display device in FIG. 2 according to an exemplary embodiment of the inventive concept.

FIG. 3 illustrates an electrical connection between the connecting film 400 and one of the driving films 300; however, electrical connections between the connecting film 400 and the other driving films 300 may be substantially the same.

Referring to FIG. 3, a plurality of gate wirings 111 and a plurality of data wirings 112 may be disposed in the display area 110 of the display panel 100. The gate wirings 111 may be arranged along the first direction D1, and may extend substantially in parallel with the second direction D2. The data wirings 112 may be arranged along the second direction D2, and may extend substantially in parallel with the first direction D1. The pixels may be disposed at intersections between the gate wirings 111 and the data wirings 112.

A plurality of connecting wirings 121 may be disposed in the non-display area 120 of the display panel 100. The connecting wirings 121 may connect the connecting film 400 and the driving film 300.

The printed circuit board 200 may be electrically connected to the driving film 300 through the connecting film 400 and the connecting wirings 121. The signals generated at the timing controller may be transmitted to the driving film 300 through the connecting film 400 and the connecting wirings 121. For example, the data signal and the control signal generated at the timing controller may be transmitted to the driving integrated circuit 350 mounted on the driving film 300 through the connecting film 400 and the connecting wirings 121.

A plurality of fan-out wirings 122 may be disposed in the non-display area 120 of the display panel 100. The fan-out wirings 122 may connect the driving film 300 and the display area 110 of the display panel 100. For example, the fan-out wirings 122 may be connected to the data wirings 112. Signals generated at the driving integrated circuit 350 may be transmitted to the display area 110 through the fan-out wirings 122. For example, the data voltage generated at the driving integrated circuit 350 may be transmitted to the pixels through the fan-out wirings 122 and the data wirings 112.

The connecting wirings 121 and the fan-out wirings 122 may cross one another. Additionally, the connecting wirings 121 and the fan-out wirings 122 may be located on different layers from one another. Accordingly, the connecting wirings 121 and the fan-out wirings 122 may be insulated from one another.

Figure 4:
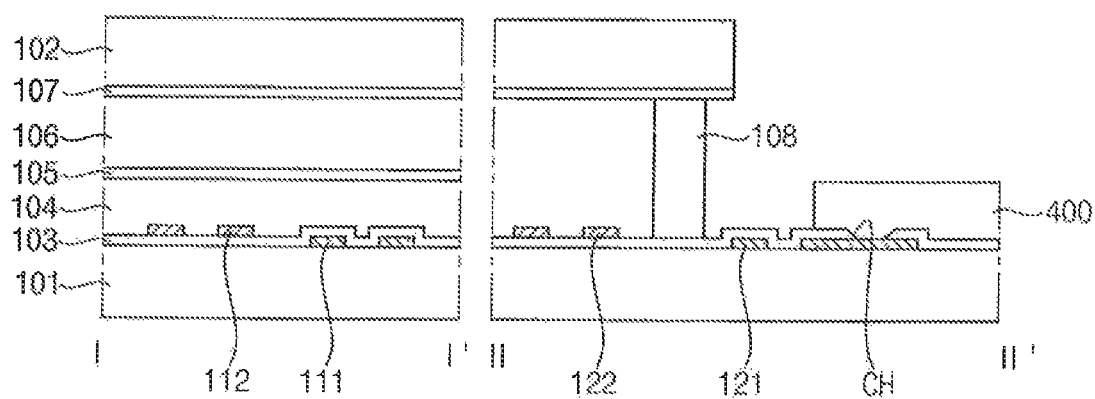
FIG. 4 is a cross-sectional view illustrating the display device in FIG. 3 cut along a line I-I' and a line II-II' according to an exemplary embodiment of the inventive concept.

FIG. 4 is a cross-sectional view illustrating the display device in FIG. 3 cut along a line I-I' and a line II-II' according to an exemplary embodiment of the inventive concept.

Referring to FIGS. 3 and 4, the display panel 100 may include a first substrate 101 and a second substrate 102, and wirings and a liquid crystal element located therebetween. In the present exemplary embodiment, the display panel 100 is a liquid crystal display panel including the liquid crystal element. However, the inventive concept is not limited thereto, and the display panel 100 may be one of various display panels, such as an organic light emitting display panel including an organic light emitting element, or the like.

The first substrate 101 and the second substrate 102 may be formed of an insulation material such as glass, quartz, ceramic, metal, plastic, or the like. Since the first substrate 101 and the second substrate 102 of the present exemplary embodiment include a flexible material such as polyimide (PI) or the like, the display panel 100 may have flexibility, by which the display panel 100 may be curved, may be completely folded or bent around one or more axes, may be stretched, or may be rolled.

The gate wirings 111 may be disposed on the first substrate 101 in the display area 110. A gate insulation layer 103 covering the gate wirings 111 may be disposed on the first substrate 101. The gate wirings 111 may transmit gate signals generated by a gate driving circuit to the pixels.

The data wirings 112 crossing the gate wirings 111 may be disposed on the gate insulation layer 103 in the display area 110. A passivation layer 104 covering the data wirings 112 may be disposed on the gate insulation layer 103. The data wirings 112 may transmit the data voltage generated by the driving integrated circuit 350 to the pixels.

The liquid crystal element including a first electrode 105, a liquid crystal layer 106, and a second electrode 107 may be disposed on the passivation layer 104 in the display area 110. Each of the pixels may include a thin film transistor connected to a respective gate wiring 111 and a respective data wiring 112, and the liquid crystal element connected to the thin film transistor. The thin film transistor may be turned on according to the gate signal transmitted through the gate wiring 111, and may apply the data voltage transmitted through the data wiring 112 to the liquid crystal element. The liquid crystal element may control luminance of light based on the data voltage.

The connecting wirings 121 may be disposed on the first substrate 101 in the non-display area 120. The connecting wirings 121 may be disposed on substantially the same layer as the gate wirings 111. The connecting wirings 121 may be substantially simultaneously formed of substantially the same material as the gate wirings 111.

The fan-out wirings 122 crossing the connecting wirings 121 may be disposed on the gate insulation layer 103 in the non-display area 120. The fan-out wirings 122 may be disposed on substantially the same layer as the data wirings 112. The fan-out wirings 122 may be substantially simultaneously formed of substantially the same material as the data wirings 112.

The connecting film 400 may be electrically connected to the connecting wirings 121. A contact hole CH exposing a portion of the connecting wirings 121 may be formed in the gate insulation layer 103, and the connecting film 400 may be in contact with the connecting wirings 121 via the contact hole CH.

A sealing member 108 may be disposed between the first substrate 101 and the second substrate 102 in the non-display area 120. The sealing member 108 may encapsulate a side portion of the display panel 100 to protect the liquid crystal element from moisture, oxygen, etc.

Hereinafter, a display device in which the connecting film 400 is bent will be described with reference to FIGS. 5 and 6.

Figure 5:
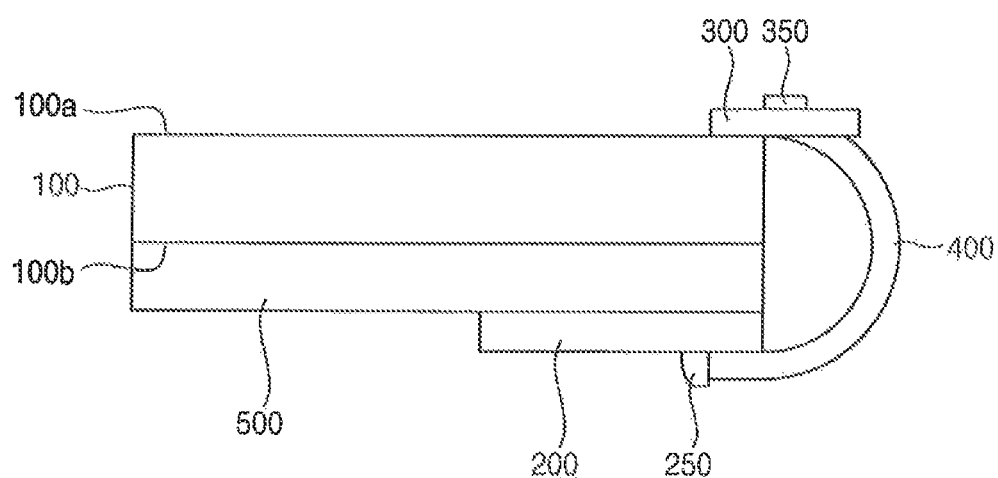
FIG. 5 is a side view illustrating a display device according to an exemplary embodiment of the inventive concept.

FIG. 5 is a side view illustrating a display device according to an exemplary embodiment of the inventive concept.

Referring to FIGS. 2 and 5, a display device according to an exemplary embodiment of the inventive concept may further include a backlight unit 500. The backlight unit 500 may supply light to the display panel 100. The liquid crystal element included in the display panel 100 may display an image by controlling luminance of light supplied from the backlight unit 500.

The driving film 300 and the first end 400*a* of the connecting film 400 may be connected to a first surface 100*a* of the display panel 100. For example, the first surface 100*a* of the display panel 100 may be an upper surface of the display panel 100.

The backlight unit 500 may be disposed on a second surface 100*b* of the display panel 100 opposite to the first surface 100*a*. For example, the second surface 100*b* of the display panel 100 may be a lower surface of the display panel 100.

The connecting film 400 may be bent such that the display panel 100 and the printed circuit board 200 are opposite to each other with the backlight unit 500 in between. In other words, the connecting film 400 may be bent such that the first end 400*a* of the connecting film 400 is located on the display panel 100 and the second end 400*b* of the connecting film 400 is located under the display panel 100.

A conventional curved display device may include a plurality of driving films connecting a display panel and a printed circuit board, and the driving films may be bent while having a predetermined curvature such that the printed circuit board is disposed under the display panel. When the display panel has a curved shape, different stresses may be applied to the driving films connecting the display panel and the printed circuit board, and the driving films may be distorted because of the different stresses. However, in the display device according to exemplary embodiments of the inventive concept, the driving films 300 may not be directly connected to the printed circuit board 200, but the printed circuit board 200 and the driving films 300 may be electrically connected through the single connecting film 400, so that distortions of the driving films 300 may be prevented.

In an exemplary embodiment of the inventive concept, the driving film 300 may be substantially flat. In other words, in contrast with the connecting film 400 that is bent, the driving film 300 may not be bent. As mentioned above, a length of the driving film 300 in the first direction D1 may be less than a length of the connecting film 400 in the first direction D1. Accordingly, although the driving film 300 is not bent, an area of a dead space of the display device may not be excessively increased.

Figure 6:
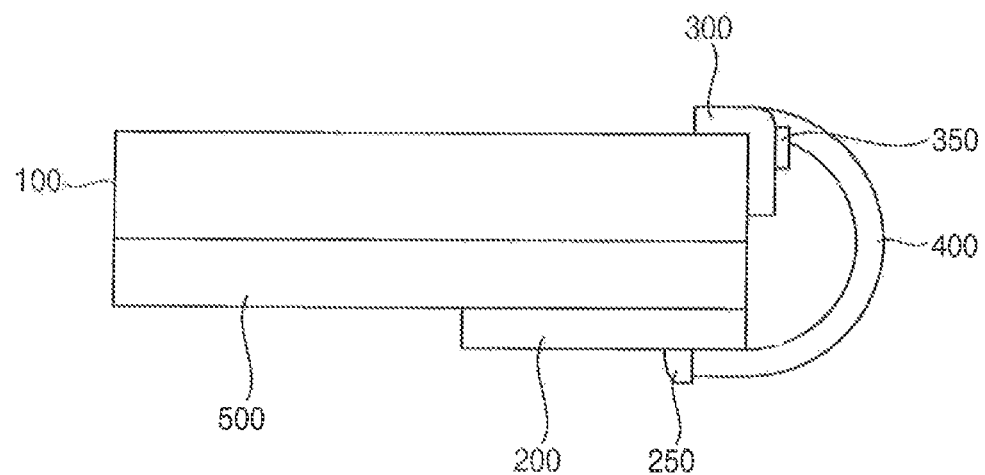
FIG. 6 is a side view illustrating a display device according to an exemplary embodiment of the inventive concept.

FIG. 6 is a side view illustrating a display device according to an exemplary embodiment of the inventive concept.

Referring to FIG. 6, the driving film 300 may be bent. For example, the driving film 300 may be bent toward a lower direction along an outer surface of the display panel 100, as illustrated in FIG. 6. In this case, an area of a dead space of the display device may be decreased.

The display device according to exemplary embodiments of the inventive concept may be applied to a display device included in a computer, a notebook, a mobile phone, a smartphone, a smart pad, a portable multimedia player (PMP), a personal digital assistant (PDA), an MP3 player, or the like.

As described above, the display device according to exemplary embodiments of the inventive concept may include the connecting film connecting the printed circuit board and the display panel to which the driving film is attached. Accordingly, the printed circuit board may not be directly connected to the driving film, so that a distortion of the driving film caused by a bending of the display panel in a curved shape may be prevented.

While the inventive concept has been shown and described with reference to exemplary embodiments thereof, it will be apparent to those of ordinary skill in the art that various changes in form and details may be made thereto without departing from the spirit and scope of the inventive concept as set forth by the following claims.

What is claimed is:

1. A display device comprising:
   a display panel having a display area and a non-display area, the display panel having a curved shape;
   a printed circuit board located in a first direction from the non-display area configured to generate a signal;
   a driving film connected to the non-display area of the display panel, wherein the driving film is substantially flat;
   a driving integrated circuit disposed on the driving film, and configured to drive the display panel in response to the signal; and
   a flexible connecting film having a first end connected to the non-display area of the display panel and a second end connected to the printed circuit board, wherein the connecting film electrically connects the printed circuit board and the driving film in the non-display area,
   wherein the driving integrated circuit is spaced apart from the display panel in the first direction by the driving film so as not to overlap the display panel in a thickness direction of the display panel.

2. The display device of claim 1, wherein the display panel comprises a connecting wiring disposed on the non-display area, and
   the connecting wiring connects the connecting film and the driving film.

3. The display device of claim 2, wherein the signal is transmitted from the printed circuit board to the driving film through the connecting film and the connecting wiring.

4. The display device of claim 2, wherein the display panel further comprises a fan-out wiring disposed on the non-display area, and
   the fan-out wiring connects the driving film and the display area.

5. The display device of claim 4, wherein the display panel further comprises a gate wiring and a data wiring disposed on the display area, wherein the gate wiring and the data wiring cross each other, wherein the connecting wiring is disposed on the same layer as the gate wiring, and wherein the fan-out wiring is disposed on the same layer as the data wiring.

6. The display device of claim 1, wherein the driving film is spaced apart from the printed circuit board.

7. The display device of claim 1, wherein the plurality of driving films are connected to the non-display area along a second direction crossing the first direction, and wherein the connecting film is connected to a center of the non-display area.

8. The display device of claim 1, wherein the connecting film is bent.

9. The display device of claim 1, further comprising a backlight unit configured to supply light to the display panel, wherein the first end of the connecting film is disposed on a first surface of the display panel, and wherein the backlight unit is disposed on a second surface of the display panel opposite to the first surface.

10. The display device of claim 9, wherein the connecting film is bent such that the display panel and the printed circuit board are opposite to each other with the backlight unit disposed in between the display panel and the printed circuit board.

11. The display device of claim 1, wherein the printed circuit board includes a connector connected to the connecting film.

12. The display device of claim 1, wherein the connecting film is one of a flexible flat cable (FFC) or a flexible printed circuit (FPC).

13. The display device of claim 1, wherein a length of the connecting film in the first direction is greater than a length of the driving film in the first direction.

14. The display device of claim 1, wherein the driving integrated circuit is mounted on the driving film in a chip-on-film (COF) manner.

15. The display device of claim 1, wherein the display panel has a curved shape along a second direction crossing the first direction.

16. A display device comprising:

a curved display panel including data wirings;

a printed circuit board spaced apart from the display panel;

a plurality of driving films connected to the display panel, wherein each of the plurality of driving films are substantially flat;

a plurality of driving integrated circuits, wherein each driving integrated circuit is disposed on a corresponding driving film of the plurality of driving films, and wherein the plurality of driving integrated circuits is configured to drive the display panel; and a flexible connecting film having a first end connected to the printed circuit board and a second end attached within the display panel, wherein the second end is connected to the plurality of driving films in a non-display area of the display panel, wherein the connecting film is electrically connected to the plurality of driving films via connecting wirings disposed on a first layer, and wherein the plurality of driving films are electrically connected to the data wirings via fan-out wirings disposed on a second layer different than the first layer.

17. A display device comprising:

a curved display panel having a first surface and a second surface opposite to the first surface;

a backlight unit disposed on the second surface of the display panel;

a printed circuit board disposed on the backlight unit, wherein the backlight unit is disposed between the printed circuit board and the display panel;

a driving film disposed on the first surface of the display panel, wherein the driving film is substantially flat;

a driving integrated circuit disposed on and electrically connected to the driving film, and configured to drive the display panel;

a connecting film connecting the printed circuit board and the first surface of the display panel, connecting wirings connecting the driving film to the connecting film; and fan-out wirings connecting the driving film to the display panel, wherein:

the connecting film is attached at a center of a non-display area of the display panel, the connecting wirings are disposed beneath a gate insulation layer, and the fan-out wirings are disposed above the gate insulation layer.

* * * * *